United States Patent [19]

Kitaoka et al.

[11] Patent Number: 5,523,608
[45] Date of Patent: Jun. 4, 1996

[54] SOLID STATE IMAGING DEVICE HAVING A SOLID STATE IMAGE SENSOR AND ITS PERIPHERAL IC MOUNTED ON ONE PACKAGE

[75] Inventors: Kouki Kitaoka, Sakurai; Takamichi Maeda, Ikoma; Shozo Minamide, Naga-ken, all of Japan

[73] Assignee: Sharp Kabushiki Kaisha, Osaka, Japan

[21] Appl. No.: 316,813

[22] Filed: Oct. 3, 1994

Related U.S. Application Data

[63] Continuation of Ser. No. 114,609, Aug. 31, 1993, abandoned.

[30] Foreign Application Priority Data

Sep. 1, 1992 [JP] Japan ................... 4-233248

[51] Int. Cl.$^6$ ............... H01L 31/0232; H01L 23/28; H01L 23/495
[52] U.S. Cl. ............ 257/433; 257/676; 257/680; 257/723; 257/787
[58] Field of Search .................. 257/723, 724, 257/667, 680, 440, 462, 433, 434, 787, 432, 676, 725

[56] References Cited

U.S. PATENT DOCUMENTS

| | | |
|---|---|---|
| 4,663,833 | 5/1987 | Tanaka et al. ............ 257/667 |
| 4,894,707 | 1/1990 | Yamawaki et al. ............ 257/680 |
| 5,079,190 | 1/1992 | Mihara ............ 437/220 |
| 5,220,198 | 6/1993 | Tsuji ............ 257/723 |

FOREIGN PATENT DOCUMENTS

| | | | |
|---|---|---|---|
| 5782885 | 6/1980 | Japan . | |
| 58-209148 | 12/1983 | Japan ............ | 257/725 |
| 60-257546 | 12/1985 | Japan ............ | 257/434 |
| 61-225827 | 10/1986 | Japan ............ | 257/685 |
| 62-122161 | 6/1987 | Japan ............ | 257/685 |
| 63-043353 | 2/1988 | Japan ............ | 257/434 |
| 2260658 | 10/1990 | Japan ............ | 257/434 |
| 2-402643 | 12/1990 | Japan . | |
| 4255264 | 9/1992 | Japan ............ | 257/434 |

*Primary Examiner*—Stephen D. Meier
*Assistant Examiner*—T. M. Arroyo
*Attorney, Agent, or Firm*—David G. Conlin; Kevin J. Fournier

[57] ABSTRACT

A peripheral IC 6 for a solid state imaging device is mounted on an island 7 of a lead frame and thereafter covered and sealed by a molding resin, thus forming a premolded package 2. Subsequently, a solid state image sensor 1 is mounted on the island 7 on one side thereof facing an opening. Thereafter, for protection of the solid state image sensor 1, a transparent lid 11 is attached to the premolded package 2 by adhesive. As a result, packaging area can be reduced in mounting the solid state image sensor on a packaging substrate, allowing video equipment such as video cameras to be miniaturized.

6 Claims, 5 Drawing Sheets

SOLID STATE IMAGING DEVICE HAVING A SOLID STATE IMAGE SENSOR AND ITS PERIPHERAL IC MOUNTED ON ONE PACKAGE

This a continuation of application Ser. No. 08/114,609 filed Aug. 31, 1993, abandoned.

BACKGROUND OF THE INVENTION

1. Field of the Invention

The present invention relates to a solid state imaging device having a solid state image sensor mounted on a premolded package.

2. Description of the Prior Art

FIG. 4 is a sectional view of a conventional solid state imaging device using a premolded package (hereinafter, referred to as "package"), while FIG. 5 illustrates the process of manufacturing the solid state imaging device.

Referring to FIG. 4 and FIGS. 5 (a) to (d), the process of manufacturing a conventional solid state imaging device using the package is described below.

First, a metallic lead frame L having a specified pattern formed by etching, pressing, or other like method is sandwiched between a first upper die 12 and a lower die 13. Thereafter, in order to ensure an opening for mounting a solid state image sensor 1, a space S corresponding to the shape of a package 15 is formed by inserting a second upper die 14 into the first upper die 12 (FIG. 5 (a)).

Subsequently, a molding resin 8 composed of a thermosetting epoxy resin or the like is injected into the space S. The molding resin 8, after injection, is kept under dwell pressure for a specified time until the molding resin 8 is cured. Then, the second upper die 14 is separated from the molded package 15 and subsequently the molded package 15 is released from the first upper die 12 and the lower die 13. After this, since the molding resin 8 of the molded package 15 is not sufficiently cured at this stage, it is heated for a further specified time so that the molding resin 8 is completely cured.

Next, resin burrs (not shown) that have overflowed from the clearances of the first upper die 12, the lower die 13, and the second upper die 14 to the lead frame L, adhering to excess portions on the lead frame, are removed. Then outer leads 4 of the lead frame L are tin- or solder-plated, bent into a specified shape and cut off, thus completing a unitary package 15 (FIG. 5 (b)).

Next, the solid state image sensor 1 cut in chips is die-bonded into the opening of the package 15 through Ag paste or the like 9. Thereafter, an aluminum thin wire or gold thin wire 5 is wire-bonded between an aluminum electrode (not shown) on the solid state image sensor 1 and an inner lead 3 of the lead frame L of the molded package 15, thereby ensuring electrical conduction to each other (FIG. 5 (c)).

Next, with a view to protecting the solid state image sensor 1 from moisture, contaminations, and others outside the molded package 15, and also to receiving rays of light converged by the lens of a video camera or the like, a transparent lid 11 made of glass or the like is attached to the molded package 15 with adhesive 10 composed of epoxy resin or the like (FIG. 5 (d)).

The above-described solid state imaging device packaged on a premolded package, when mounted on video equipment such as video cameras, encounters the following problems.

To make up a video camera or the like, it is necessary to also mount a peripheral IC (integrated circuit) for use in a solid state imaging device (hereinafter, referred to as "peripheral IC") on the video equipment. However, if the solid state image sensor and the peripheral IC are packaged on different packages, as has been the conventional case, their occupying area on a packaging substrate should necessarily be increased by their independence so that the recent years' demand for miniaturizing video cameras and other equipment could not be met satisfactorily.

SUMMARY OF THE INVENTION

The object of the present invention is therefore to provide a solid state imaging device which allows its packaging area to be reduced by mounting a solid state image sensor and an peripheral IC within one package.

In order to achieve the object, there is provided a solid state imaging device, comprising: an integrally molded resin block; a lead frame molded integrally with the molded resin block, having a mount portion one surface of which is covered with the molded resin block and the other surface of which is not covered with the molded resin block, an inner lead portion, and an outer lead portion; a solid state image sensor mounted on the other surface of the mount portion of the lead frame; and one or a plurality of peripheral circuits for the solid state image sensor, mounted on the one surface of the mount portion of the lead frame, covered and molded integrally with the molded resin block, and electrically connected to the inner lead portion.

It is preferable that the mount portion of the lead frame is an island portion.

Further, it is preferable that the molded resin block is formed into a boat shape, the solid state image sensor and the peripheral circuit are disposed on the bottom of the boat-shaped molded resin block, and a transparent lid is fixed by adhesive at an upper end of the molded resin block to thereby seal the solid state image sensor.

Also, there is provided a method for manufacturing a solid state imaging device, comprising: a step for die-bonding a peripheral circuit for a solid state image sensor to an island portion of a lead frame having the island portion, an inner lead portion, and an outer lead portion and moreover wire-bonding the peripheral circuit and the inner lead portion of the lead frame via a wire to thereby electrically connect them to each other; a step for sandwiching the lead frame, on which the peripheral circuit has been die-bonded and which has been wire-bonded in the preceding step, between a first upper die and a lower die with a clearance provided around the peripheral circuit, and further inserting a second upper die so as to form an opening in a molded resin block to be made for mounting the solid state image sensor, in such a way that the second upper die penetrates through the first upper die to be brought into contact with one surface of the island portion of the lead frame opposite to the surface on which the peripheral circuit is mounted, whereby a space corresponding to the molded resin block to be made is formed; a step for burying both the peripheral circuit and the wire into the molded resin block by injecting a resin into the space to mold the molded resin block integrally with the lead frame, the peripheral circuit, and the wire; a step for die-bonding the solid state image sensor on one surface of the island portion of the lead frame opposite to the surface on which the peripheral circuit is mounted and moreover wire-bonding the solid state image sensor and the inner lead portion of the lead frame via a wire; and a step for fixing a transparent lid to the molded resin block by adhesive to thereby seal the opening of the molded resin block.

With the application of the solid state imaging device of the present invention, where the solid state image sensor and the peripheral circuit are mounted on one package, the packaging area for their mounting onto a packaging substrate can be reduced to smaller than conventional counterparts in which a solid state image sensor and a peripheral circuit are packaged on different packages.

BRIEF DESCRIPTION OF THE DRAWINGS

The present invention become more fully understood from the detailed description given hereinbelow and the accompanying drawings which are given by way of illustration only, and thus are not limitative of the present invention, and wherein.

DETAILED DESCRIPTION OF THE PREFERRED EMBODIMENTS

The present invention is now described in detail based on an embodiment thereof.

Figure 1:
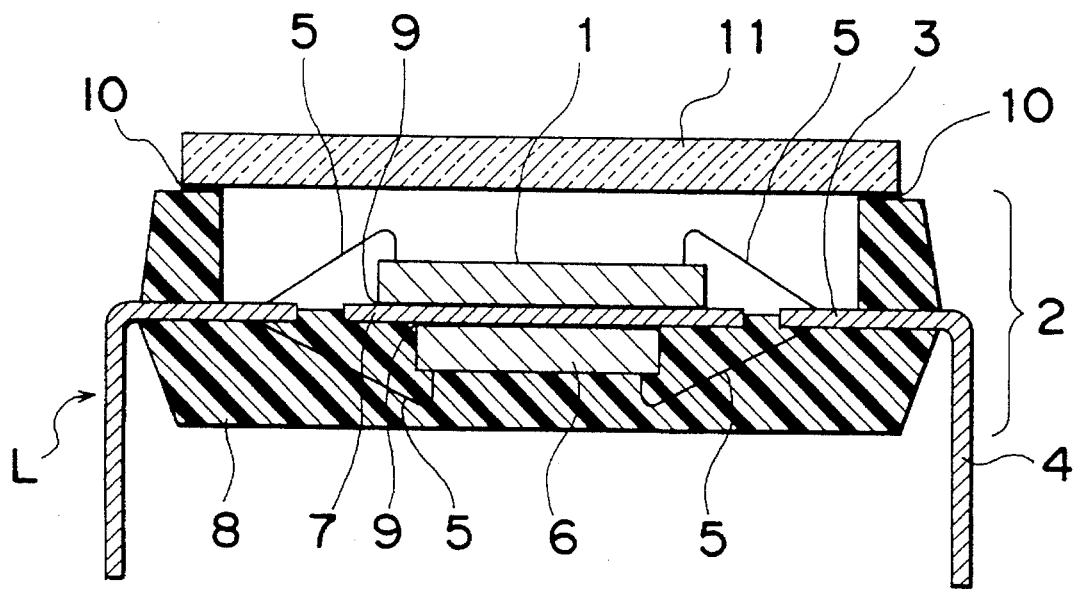
FIG. 1 is a sectional view of a solid state imaging device using a premolded package according to an embodiment of the present invention.
Figure 2:
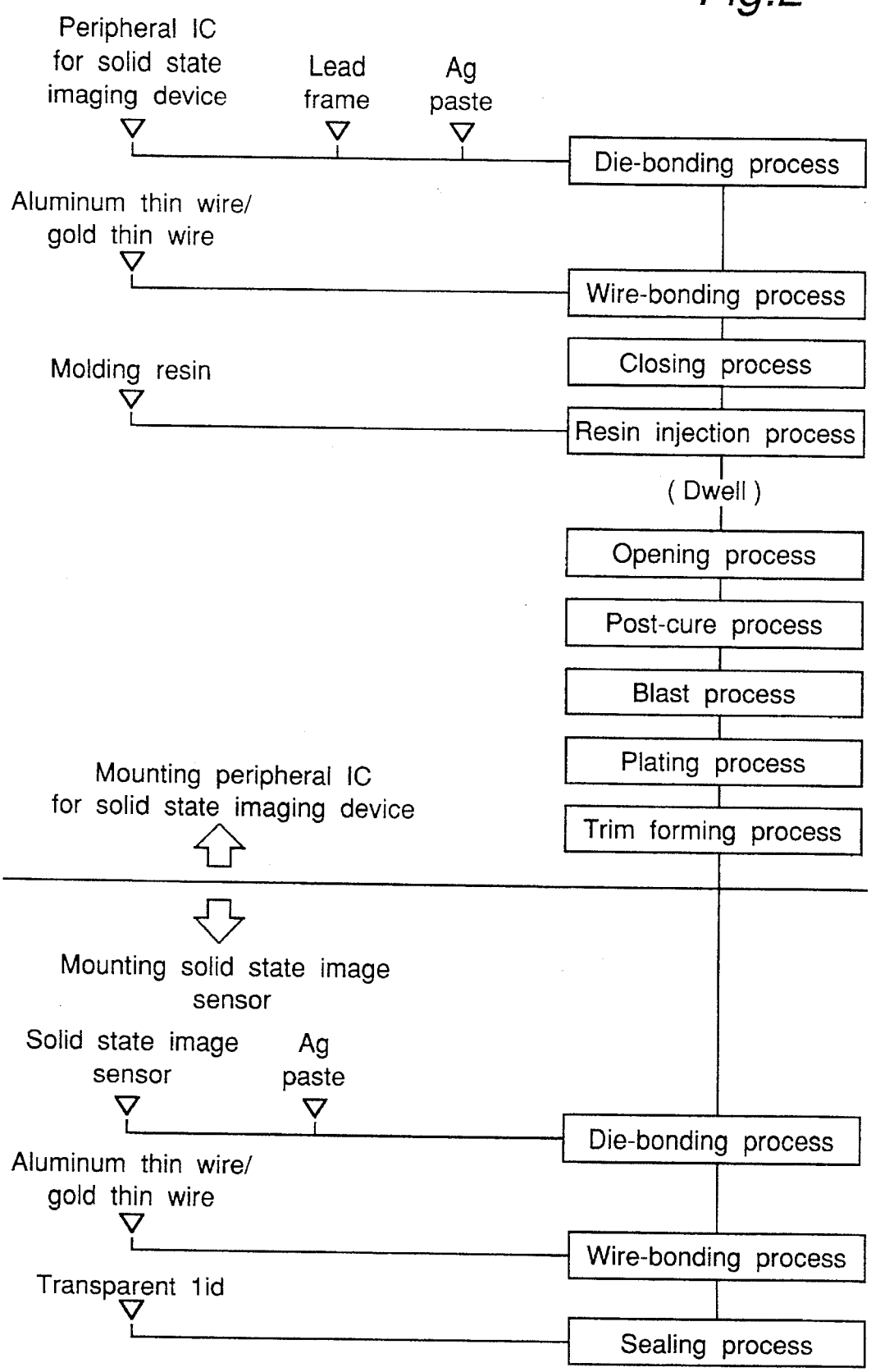
FIG. 2 is a flow diagram of the manufacturing process of the same solid state imaging device.
Figure 3A:
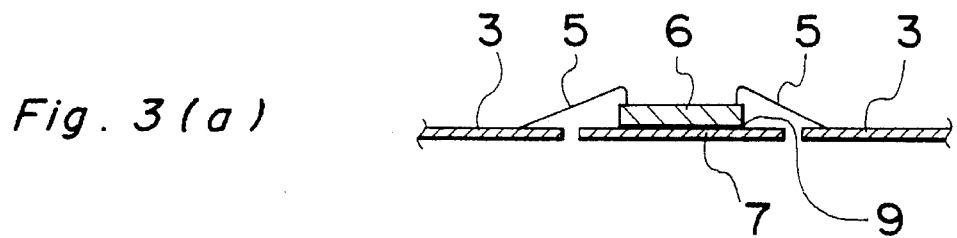
FIGS. 3 (a), 3 (b), 3 (c), 3 (d), and 3 (e) are views of the manufacturing process of the same solid state imaging device.
Figure 3B:
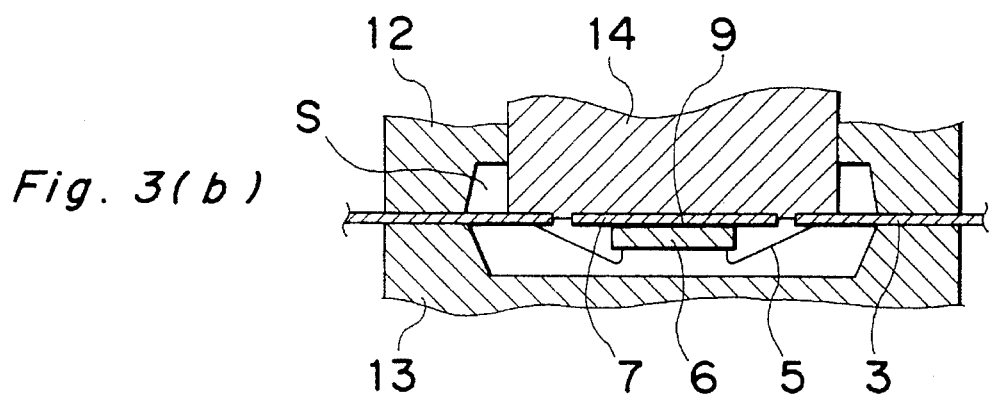
Figure 3C:
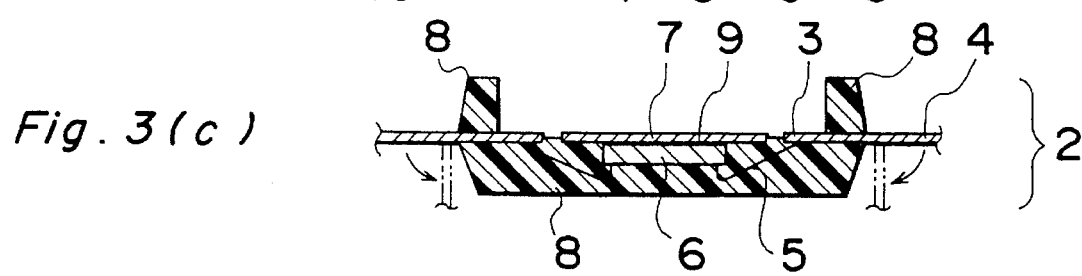
Figure 3D:
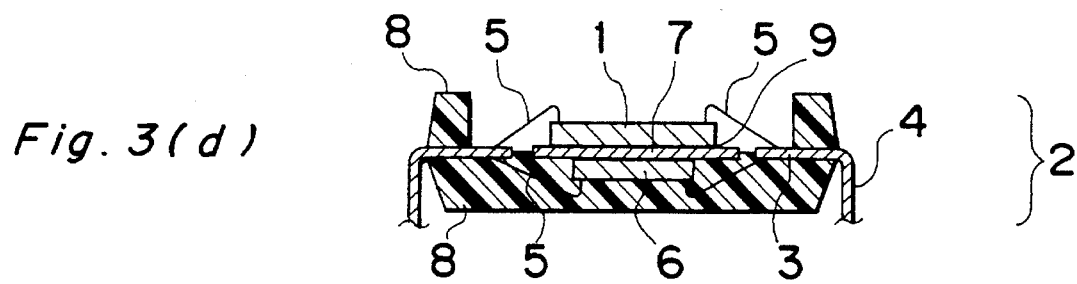
Figure 3E:
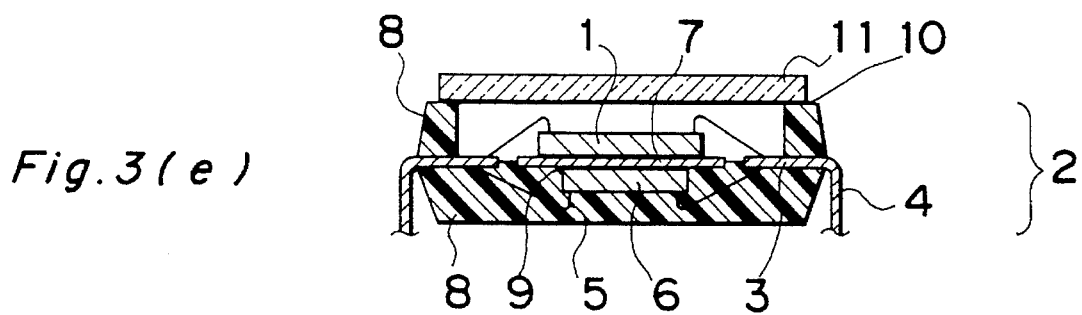
Figure 4:
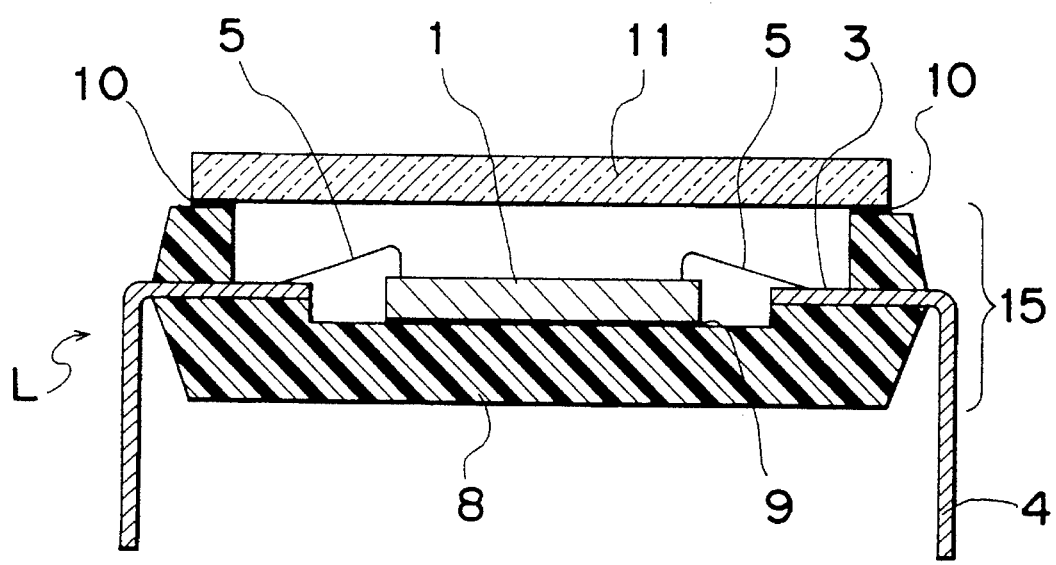
FIG. 4 is a sectional view of a conventional solid state imaging device using a premolded package.
Figure 5A:
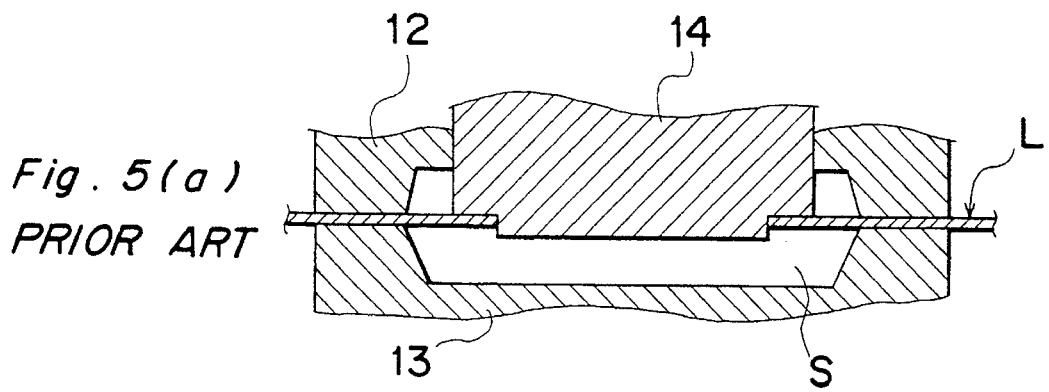
FIGS. 5 (a), 5 (b), 5 (c), and 5 (d) are views of the manufacturing process of the same solid state imaging device.
Figure 5B:
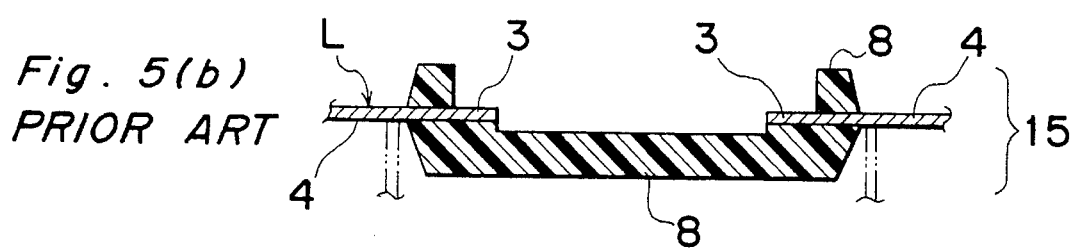
Figure 5C:
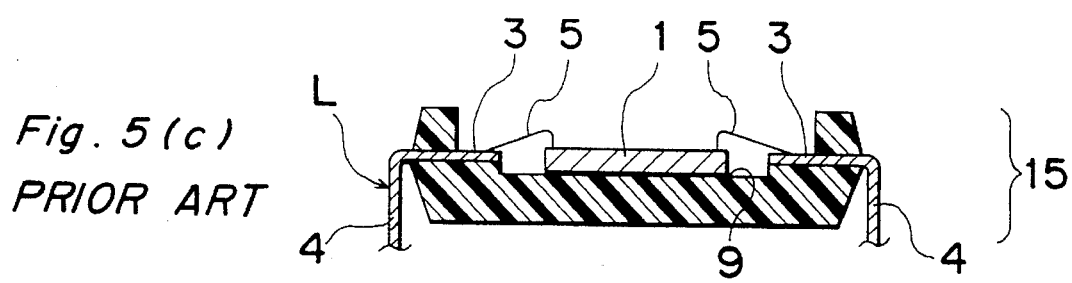
Figure 5D:
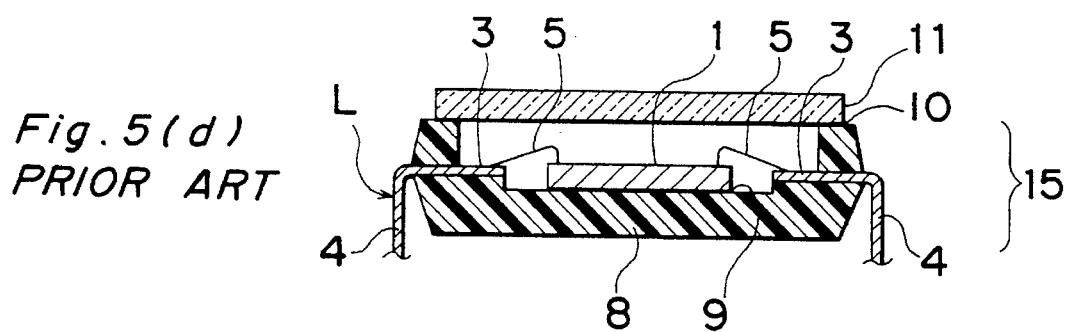

FIG. 1 is a sectional view of a solid state imaging device using a premolded package according to an embodiment of the present invention; FIG. 2 is a flow diagram of the manufacturing process of the same solid state imaging device; and FIGS. 3 (a) through (e) are views of the manufacturing process of the same solid state imaging device.

As shown in FIG. 1, the solid state imaging device using a premolded package of the present invention is characterized in that it has a solid state image sensor mounted on one surface of an island 7 of a lead frame L on the opening side of a boat-shaped molded resin block 8, and a peripheral IC 6 for the solid state imaging device (hereinafter, referred to as "peripheral IC") mounted on the other surface of the island 7 which is to be sealed by the molded resin block 8, wherein the peripheral IC 6 and the solid state image sensor 1 are mounted on one premolded package 2 (hereinafter, referred to as "package").

Referring to FIG. 1, reference numeral 3 denotes an inner lead of the lead frame L; 4 represents an outer lead of the lead frame L; 5 designates an aluminum thin wire or gold thin wire; 9 designates Ag paste or the like; indicates adhesive; and 11 indicates a transparent lid.

Next, the process of manufacturing the solid state imaging device using a premolded package according to an embodiment of the present invention is described with reference to FIGS. 1 through 3.

First, at least one peripheral IC 6 cut in chips is die-bonded onto the island 7 of the lead frame L made of a metal having a specified pattern formed by etching or pressing or other like method, with the Ag paste or the like 9 in the "die-bonding" process as shown in FIG. 2. Thereafter, in the "wire-bonding" process as shown in FIG. 2, an aluminum electrode (not shown) on the peripheral IC 6 and the inner lead 3 of the lead frame L are made electrically conductive to each other positively by wire-bonding the aluminum thin wire or gold thin wire 5 to both of them (FIG. 3 (a)).

Next, after the wire-bonded lead frame L is sandwiched between a first upper die 12 and a lower die 13 in the "closing process" as shown in FIG. 2, a space S corresponding to the shape of the package 2 is ensured by inserting a second upper die 14 into the first upper die 12 so that the opening for mounting the solid state image sensor 1 is ensured (FIG. 3 (b)). In doing this, the second upper die 14 is required only to be positioned into contact with the island 7 on the side on which the solid state image sensor 1 is mounted, thus not necessarily requiring the lead frame L to be reversed as shown in this embodiment.

Subsequently, in the "resin injection process" as shown in FIG. 2, the molded resin block 8 composed of a thermosetting epoxy resin or the like is injected into this space S, whereby the peripheral IC 6 is completely sealed by the molded resin block 8. Thereafter, the molded resin block 8 is kept under dwell pressure for a specified time until the resin is cured, and then in the "opening process" as shown in FIG. 2, the second upper die 14 is released from the molded package 2. This is followed by releasing the molded package 2 from the first upper die 12 and the lower die 13. Since the molded resin block 8 of this molded-package 2 has not been cured sufficiently at this stage, the molded resin block 8 is further heated for a specified time in the "post-cure process," thereby curing the molded resin block 8. The molded resin block 8 is formed into a boat-shape.

Subsequently, resin burrs (not shown) that have overflowed from the clearances of the first upper die 12, the lower die 13, and the second upper die 14 to the lead frame L, adhering to excess portions on the lead frame L, in the "resin injection process" as shown in FIG. 2 are removed in the "blast process" as shown in FIG. 2. Thereafter, the outer lead 4 is tin- or solder-plated in the "plating process" as shown in FIG. 2, and the outer lead 4 is bent into a specified shape and cut off, thus forming a unitary package 2 in the "trim forming process" as shown in FIG. 2 (FIG. 3 (c)).

Subsequently, the solid state image sensor 1 cut in chips is die-bonded onto the island 7 on one side thereof facing an opening, with the Ag paste or the like 9, in the "die-bonding process" as shown in FIG. 2. When this is completed, the solid state image sensor 1 and the peripheral IC 6 are mounted on the front and rear sides of the same island 7, respectively. Thereafter, in the "wire-bonding process", the aluminum thin wire or gold thin wire 5 is wire-bonded between the aluminum electrode (not shown) on the solid state image sensor 1 and the inner lead 3 of the lead frame L, thereby ensuring electrical conduction to each other (FIG. 3 (d)). It is to be noted that the electrical conduction between the solid state image sensor 1 and the peripheral IC 6 is also ensured through the inner lead 3.

Subsequently, after the "wire-bonding process" as shown in FIG. 2, with a view to protecting the solid state image sensor 1 from moisture, contaminations, and others outside the package, and also to receiving by the solid state image sensor 1 rays of light converged by the lens of a video camera or the like, the transparent lid 11 made of glass or the like is attached to the package 2 with the adhesive 10 composed of epoxy resin or the like, in the "sealing process" as shown in FIG. 2 (FIG. 3 (e)).

As described hereinabove, according to the present invention, since a solid state image sensor and a peripheral IC for a solid state imaging device are mounted on one premolded package, packaging area involved in mounting them on a packaging substrate can be reduced, compared with the conventional counterparts. This allows video equipment such as video cameras to be miniaturized, while the connecting distance between the solid state image sensor and the peripheral IC for a solid state imaging device can be made shorter than it has been conventionally. Thus, the solid state imaging device becomes insusceptible to external noise and facilitates its circuit design.

Furthermore, since the molding process of the premolded package can be carried out at one time, it becomes feasible to reduce the cost by reducing the number of manufacturing steps.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A solid state imaging device, comprising:

a container which is an integrally molded resin block and has an opening;

a lead frame molded integrally with the container, having a mount portion which is disposed on an inner bottom surface of the container, an inner lead portion within the container, and an outer lead portion which is disposed outside the container;

a solid state image sensor mounted on an upper surface of the mount portion of the lead frame, and electrically connected to the inner lead portion;

one or a plurality of peripheral circuits for the solid state image sensor, mounted directly on an under surface of the mount portion of the lead frame, covered and molded integrally with the molded resin block, and electrically connected to the inner lead portion; and a lid which is attached to the container so as to seal the opening of the container in order to protect the solid state image sensor.

2. A solid state imaging device as claimed in claim 1, wherein the mount portion of the lead frame is an island portion.

3. A solid state imaging device as claimed in claim 1, wherein one part of the inner lead portion is disposed on an inner bottom surface of the container and the other part of the inner lead portion passes through a side wall of the container.

4. A solid state imaging device as claimed in claim 1, wherein the solid state imaging sensor is mounted opposite to the one or the plurality of peripheral circuits, thereby said mount portion being interposed between the solid state image sensor and the one or the plurality of peripheral circuits.

5. A solid state imaging device as claimed in claim 1, wherein the container has a boat shape.

6. The solid state imaging device as claimed in claim 1, wherein the peripheral circuit and the inner lead portion are electrically connected to each other with wire bonding.

* * * * *